United States Patent [19]

Kasson

[11] 3,999,129

[45] Dec. 21, 1976

[54] METHOD AND APPARATUS FOR ERROR REDUCTION IN DIGITAL INFORMATION TRANSMISSION SYSTEMS

[75] Inventor: James M. Kasson, San Mateo, Calif.

[73] Assignee: Rolm Corporation, Cupertino, Calif.

[22] Filed: Apr. 16, 1975

[21] Appl. No.: 568,769

[52] U.S. Cl. .................. 325/42; 325/65; 340/347 AD
[51] Int. Cl.² ......................... H04B 1/00
[58] Field of Search .......... 325/65, 42, 38 R, 38 A, 325/41; 178/68; 340/347 AD

[56] References Cited

UNITED STATES PATENTS

| | | | |
|---|---|---|---|
| 3,244,808 | 4/1966 | Roberts | 325/65 |
| 3,562,420 | 2/1971 | Thompson | 325/42 |
| 3,614,622 | 10/1971 | Holsinger | 325/42 |
| 3,656,152 | 4/1972 | Gundersen | 340/347 AD |
| 3,877,022 | 4/1975 | Lehman et al. | 340/347 AD |
| 3,881,097 | 4/1975 | Lehmann et al. | 235/156 |

OTHER PUBLICATIONS

"Dithering Increases Dynamic Range and Improves Linearity", Federal Scientific Corporation, Aug. 24, 1973; pp. 1-8.

*Primary Examiner*—Robert L. Griffin
*Assistant Examiner*—Jin F. Ng
*Attorney, Agent, or Firm*—Townsend and Townsend

[57] ABSTRACT

A method and apparatus for reducing idle channel noise, cross talk and quantizing error noise in a digital information transmission system designed for operation over a predetermined frequency spectrum and having an analog-to-digital converter, an information transmission medium, and a digital-to-analog converter all located between a transmitting station and a receiving station. A controlled noise signal having an amplitude lying in the range from about ¼ to ½ of the magnitude of a quantizing interval of the ADC and DAC and a frequency content concentrated at ($n+½$) times the ADC and DAC sampling frequency but outside the system frequency spectrum is added to the analog information input signals prior to conversion to digital form. The injected controlled noise signal predominates whenever the amplitude of spurious noise signals is less than the amplitude of the controlled noise signal and the level of the input to the ADC is near a quantizing interval transition point so that the subsequent analog output signals from the DAC have frequencies concentrated outside the frequency spectrum of the system. The DAC output signals are subsequently filtered by a post sampling filter having a pass band coextensive with the system frequency spectrum so that the controlled noise signal components are removed before coupling to the receiving station.

22 Claims, 6 Drawing Figures

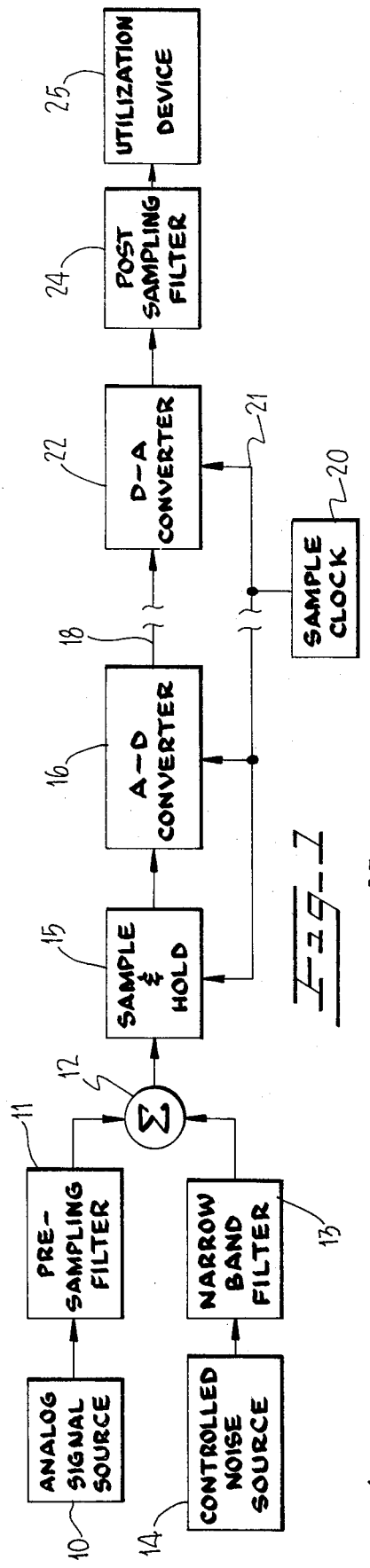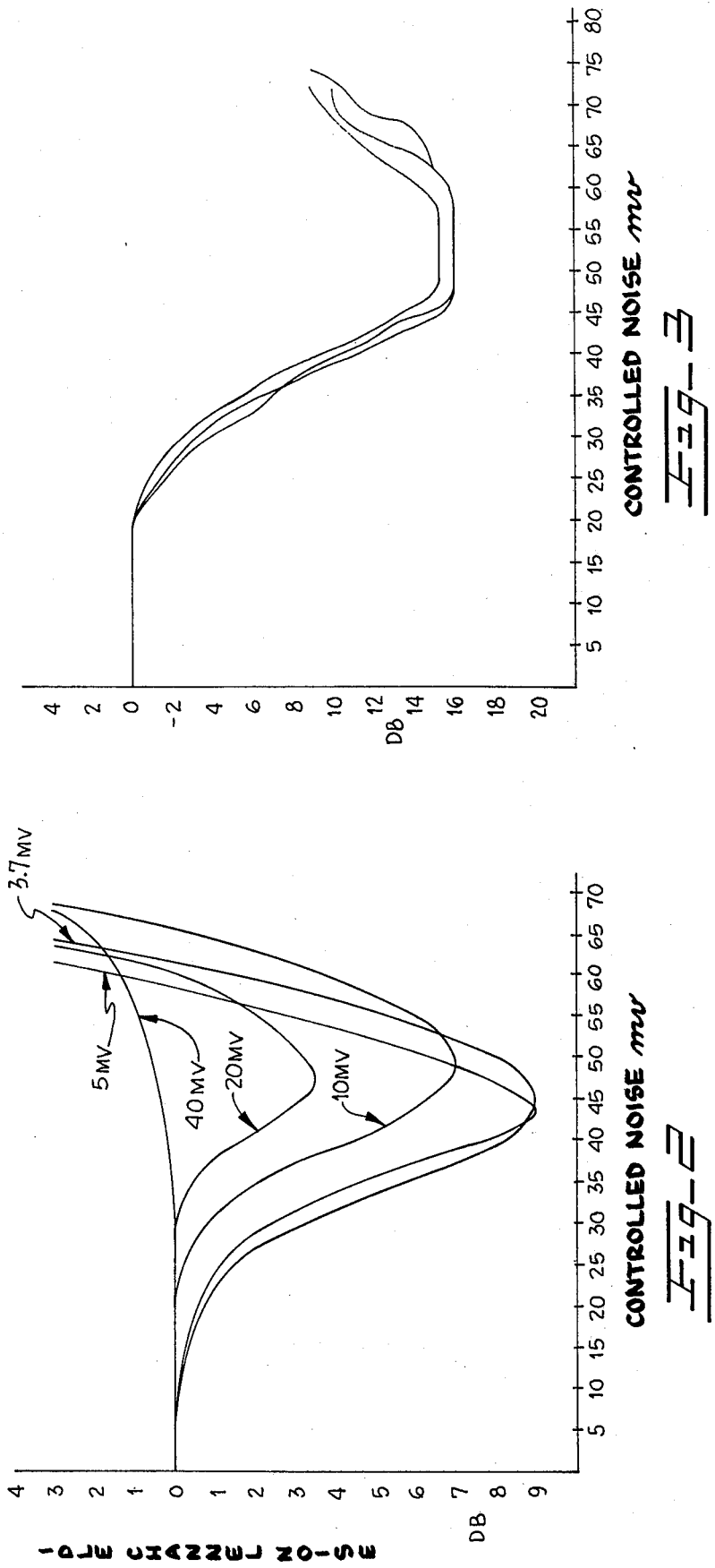

Fig. 4 — 600 HZ ANALOG INPUT SIGNAL

| OUTPUT SIGNAL freq. (Hz) | INPUT SIGNAL AMPLITUDE (mv rms) 100 | | 200 | | 400 | |
|---|---|---|---|---|---|---|
| | w/o | w | w/o | w | w/o | w |
| 600 | 0 | 0 |  |  |  |  |
| 1K | — | — | −30 | −40 | −38 | −46 |
| 1.4K | −28 | −22 | −34 | −40 | −38 | −46 |
| 1.8K | −19.5 | −32 | −38 | −40 | −38 | −45 |

OUTPUT SIGNAL AMPLITUDE (db)

w/o — WITHOUT CONTROLLED NOISE SIGNAL
w — WITH CONTROLLED NOISE SIGNAL

Fig. 5 — 700 HZ ANALOG INPUT SIGNAL

| OUTPUT SIGNAL freq. (Hz) | INPUT SIGNAL AMPLITUDE (mv rms) 100 | | 200 | | 400 | |
|---|---|---|---|---|---|---|
| | w/o | w | w/o | w | w/o | w |
| 700 | 0 | 0 | 0 | 0 | 0 | 0 |
| 1.3K | −37 | −32 | −40 | −40 | −40 | −46 |
| 2.1K | −20 | −32 | −30 | −40 | −40 | −46 |

OUTPUT SIGNAL AMPLITUDE (db)

METHOD AND APPARATUS FOR ERROR REDUCTION IN DIGITAL INFORMATION TRANSMISSION SYSTEMS

BACKGROUND OF THE INVENTION

This invention relates to information transmission systems in which information is transmitted between two or more stations in digital form. More particularly, this invention relates to the reduction of errors in digital information transmission systems.

In the field of information transmission, it is common practice to convert information from analog to digital form prior to transmission from a station at a first location and to reconvert the information received at a second location from digital to analog form. In a typical system, the analog-to-digital conversion is accomplished by sampling successive portions of the analog input signal at a rate sufficient to permit conversion in a theoretically error-free manner under idealized conditions and generating a substantially constant level signal for the duration of each sampling period, the magnitude of the constant level signal during any given period being representative of the magnitude of the analog signal at the instant of sampling. The magnitude of the constant level signal is limited to a relatively small fixed number of possible values over the entire predetermined amplitude range of the analog input signal, a process termed quantizing, and each value is assigned a different amplitude range or quantizing interval so that all signal amplitudes lying within a specific quantizing interval are converted to a constant level signal having the same magnitude. For example, in a 7 bit binary system an analog input signal having amplitudes lying in the range from 0 to 1.28 volts may be quantized into different levels each having a range of 0.01 volts so that input signals having amplitudes lying in the 0 level range from −0.005 to 0.005 volts are converted to a 0 volt level signal; input signals having amplitudes lying in the range from 0.005 to 0.015 volts are converted to a constant level signal having a magnitude of 0.01 volts; signals from 0.015 to 0.025 volts are converted to a constant level signal having a magnitude of 0.02 volts; etc. The voltage magnitudes 0.005, 0.015, 0.025 defining the end points of each range are termed the transition points.

At the receiving station, the information transmitted in digital form is ordinarily reconverted to analog form which is accomplished in the inverse manner from that described above. Such systems have found wide application, and are increasingly being used in telephone systems for transmitting speech or other analog information.

Such systems are typically designed to operate over a predetermined range of analog input signal frequencies. For example, in a telephone system application, this range is ordinarily in the audible range from about 300 to about 3,400 HZ. System response is limited to this range by filtering the analog input signals prior to the analog-to-digital conversion by means of a band pass filter having a pass band characteristic lying in the 300–3,400 HZ range; and by filtering the reconverted analog signal with a post sampling filter having a substantially identical pass band characteristic.

Such systems suffer from the disadvantage of being susceptible to random disturbing signals upstream of the analog-to-digital converter, or ADC, and lying in the frequency response range of the system, which signals are conveniently termed noise signals, as opposed to information signals whose information content is to be transmitted to the receiving station. In the presence of noise signals, the information content desired to be transmitted and received can be masked and erroneously manifested at the receiving end of the system. Ideally, under idle channel conditions, i.e. when no information is present on the input side of the system, the output of the ADC should have a constant zero level value. In practice, however, in a typical ADC the zero level range drifts. Thus, a random or spurious disturbing signal having even an extremely small amplitude can cause the ADC to generate an output signal one quantizing the value higher or lower than zero, if the zero level value has drifted close to a transition point. This erroneous output signal is then reproduced as an erroneous analog signal at the downstream digital-to-analog converter, or DAC.

In systems using a multi-channel input which is sequentially coupled to the ADC, i.e. a multiplexed multi-channel system, noise in the form of cross talk from a nearby channel is typically present. Since the cross talk noise signal has the spectral content of speech and thus lies within the frequency response range of the system, cross talk signals of even extremely small amplitude can pass through the system band pass filter and alter the magnitude of the sampled analog information input signal to a value lying within the next quantizing interval, particularly when the input signal alone is very close to a transition point. As a result, the ADC generates an erroneous output signal which is reconverted to analog form by the DAC. Since the spectrum of this signal is fundamentally a speech spectrum, any such noise can not be filtered out by the post sampling downstream from the DAC.

A third type of noise, termed "quantizing error", arises from the inability of the ADC to recognize amplitude changes in the analog information input signal which lie within a quantizing level. Such changes are not converted by the ADC and thus will not be reproduced in the DAC even though the actual magnitude of the analog information input signal may have changed between successive samples.

Attempts have been made to design systems of the above type with reduced sensitivity to idle channel, cross talk and quantizing error noise. In some systems, the number of quantizing intervals used to represent the input signal has been increased, thus decreasing the size of each quantizing interval. For systems using binary encoding, it can be shown that adding $n$ bits or $2^n$ quantizing intervals reduces the effect of this noise by $6n$ db in an ideal case, provided that the analog noise in the system remains small compared to the size of the quantizing interval. Another technique is to introduce a circuit which has greater gain for small signals than for large amplitude analog signals, termed a compressor, upstream of the ADC, and a circuit having the inverse gain characteristics of the compressor, termed an expander, downstream of the DAC. The compressor-expander arrangement effectively reduces the size of the quantizing intervals for small amplitude signals and correspondingly reduces the adverse effects of idle channel and cross talk noise. However, this arrangement has the disadvantage of introducing a non-linear response over the entire amplitude range of the analog input signals and requires further corrective circuitry in order to avoid increase in quantizing error noise.

All of the above efforts to reduce the adverse effect of idle channel cross talk and quantizing error noise on a signaling system have been found to be somewhat effective, but suffer from the serious disadvantage of increasing the cost of the circuitry required for an operable system. In highly sophisticated systems, such as those used in the telephone signaling art, this increased cost is greatly multiplied by the total number of circuits employed.

SUMMARY OF THE INVENTION

The invention comprises a method and apparatus for substantially reducing the adverse effects of idle channel, cross talk and quantizing error noise which can be implemented in an extremely inexpensive manner and which enhances the performance of digital-information transmission systems employing analog-to-digital conversion and digital-to-analog reconversion. In a broadest aspect, the invention comprises the generation of a controlled noise signal having an amplitude lying in the range from about ¼ to ½ of the magnitude of the quantizing interval and a frequency content outside the information band of interest, preferably above the upper band limit and concentrated at $(n+\frac{1}{2})$ times the ADC and DAC sampling frequency, and the summation of this controlled noise signal with the information analog signal prior to the analog-to-digital conversion. In a preferred embodiment of the invention, the information output of an analog signal source is coupled through a presampling filter having a pass band characteristic co-extensive with a desired operating range of frequencies to a first input of a summing network. A noise signal generator capable of generating controlled noise signals of the type noted above is coupled through a band pass filter having an extremely narrow pass band characteristic centered at ½ the sampling frequency to the remaining input of the summing network. The output of the summing network is coupled to the signal input of an ADC, the clock input to which is coupled to the ouput of a sample clock generator. Optionally, a sample and hold circuit also clocked by the sample clock generator output signal train is coupled between the output of the summing network and the data input of the ADC. The output of the ADC is coupled to the transmission medium, e.g. a telephone subscriber line circuit or an information bus within a PBX telephone system. At the receiving end of the transmission medium, the digital information signals are reconverted to analog form by a DAC clocked at the same frequency and in synchronism with the sample clock generator. The analog output signals from the DAC are coupled to a utilization device via a post-sampling filter having a pass band characteristic substantially identical to that of the presampling filter.

In operation, the injected controlled noise signal predominates whenever the amplitude of a spurious noise signal is less than the amplitude of the controlled noise signal and the level of the input to the ADC is near a quantizing interval transition point. Thus, in the case of idle channel noise or cross talk noise, the subsequent output of the DAC consists primarily of a signal whose frequency components are those of the controlled noise signal. Since the frequency of these components is concentrated outside the pass band of the post sampling filter, these noise signals are readily filtered out. In the case of quantizing error noise, the injected control noise signal acts as a bias signal which, when summed with a lower frequency analog information signal at the input to the ADC, causes the duty cycle of the digitized signal output from the ADC to vary. These duty cycle variations are converted by the post-sampling filter downstream from the DAC to amplitude changes which more accurately reflect the true shape of the analog input signal. Thus, amplitude variations in the analog information input signal which lie within a quantizing level are transmitted to the output of the DAC, thereby reducing quantizing error.

For a fuller understanding of the nature and advantages of the invention, reference should be had to the ensuing detailed description taken in conjunction with the accompanying drawings.

BRIEF DESCRIPTION OF THE DRAWINGS

FIG. 1 is a block diagram of a system embodying the invention;

FIGS. 2 and 3 are plots depicting the performance of the system of FIG. 1;

FIGS. 4 and 5 are tabulated test results illustrating performance of the system; and, FIG. 6 is a diagram of a preferred controlled noise source 14.

DESCRIPTION OF THE PREFERRED EMBODIMENT

Figure 6:
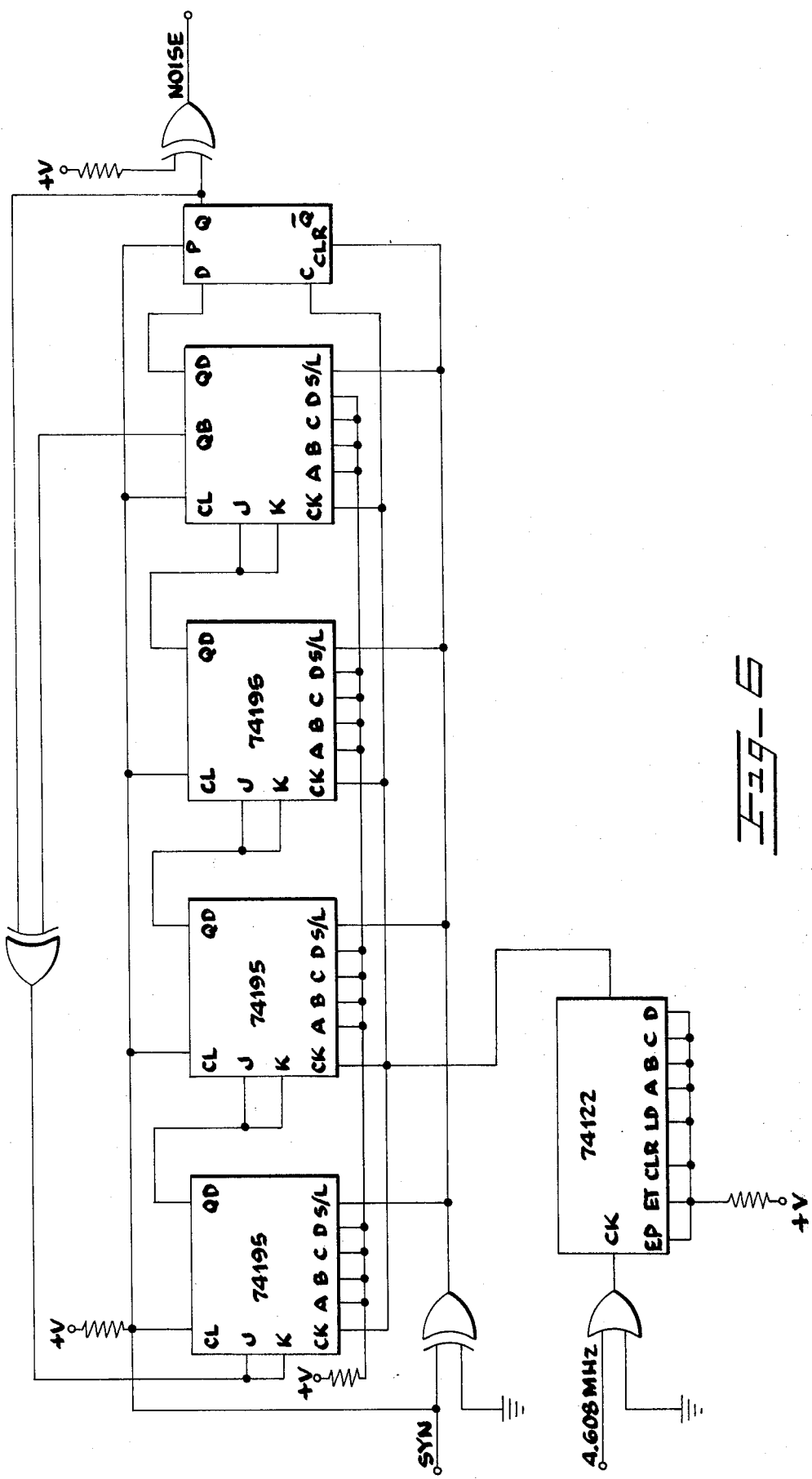

Turning now to the drawings, FIG. 1 is a block diagram of a system embodying the invention. As shown in this Fig., an analog signal source 10 has an output coupled to the input of a presampling filter 11. Signal source 10 may comprise any one of a number of analog information input devices, e.g. a standard telephone handset transmitter, a modem associated with a data set, a computer voice response unit, or the like, capable of generating analog information signals having a frequency content lying predominantly within a predetermined pass band. Presampling filter 11 comprises a band pass filter having a pass band characteristic substantially co-extensive with the range of frequencies of interest. For example, in a pulse code modulated telephone system in which the frequency spectrum is about 300 to 3,400 HZ, presampling filter 11 may comprise a four pole band pass filter having a pass band in the range from 300 to 3,400 HZ. The output of presampling filter 11 is coupled to a first input of a conventional summing network 12 having an attenuating network coupled to the second input for a purpose to be described.

The remaining input to summing network 12 is the output of a narrow band filter 13, the input to which is the output of a controlled noise source 14. Noise source 14 may comprise any one of a number of known oscillator circuits capable of generating an output signal train having a predetermined frequency and amplitude selected in accordance with the criteria described below. In the preferred embodiment, controlled noise source 14 comprises the circuit shown in FIG. 6, which is a 17 bit shift register having as an input the exclusive OR of the 14 and 17 bits and a clock frequency sufficiently high to generate a noise signal having a frequency content which is essentially flat to above 6 KHZ.

Narrow band filter 13 comprises a band pass filter having an extremely narrow pass band characteristic centered about the desired controlled noise frequency. In the preferred embodiment, narrow band filter 13 has a band pass centered about 6 KHZ and a Q of 40 which provides an output signal having an rms value of 2.5 volts.

The output of summing network 12 is coupled to the signal input of a conventional sample and hold circuit 15, the output of which is coupled to the signal input of a conventional analog-to-digital converter 16. In the preferred embodiment, sample and hold circuit 15 has a settling time of 3.9 microseconds, and ADC 16 provides a 12 bit parallel binary output signal and is sampled every 83 microseconds. The data output of ADC 16 is coupled to the input of transmission medium 18. The clock input of sample and hold circuit 15 and ADC 16 is coupled to the output of a sample clock generator 20 which preferably comprises a clock pulse generator capable of generating output pulses having a frequency of 12 KHZ, with each pulse width being approximately 100 nanoseconds.

The frequency and amplitude of the controlled noise source signal train are selected in accordance with the following criteria. Once the range of frequencies of interest of the analog information signals are chosen, the frequency of sample clock generator 20 can be selected in accordance with the Nyquist criteria. The magnitude and number of the quantizing intervals can thereafter be selected in accordance with the desired degree of precision and the amplitude range of the analog signals to be processed. Once the sampling frequency and the quantizing intervals are known, the controlled noise source 14 is adjusted to generate an output signal train, having a frequency outside the frequency band of interest. The frequency of the controlled noise source may be either below or above this frequency band and best results are obtained at $(n+\frac{1}{2})$ times the sampling frequency, where $n=0,1,2,...$ . The rms amplitude of the controlled noise signal train is selected to have a convenient value, and the attenuator in the summing network is adjusted to attenuate the amplitude of the controlled noise signal train to a value which lies in the range from about ¼ to ½ the magnitude of the quantizing intervals of ADC 16. In the specific example given above, for example, for information input signals lying in the range from 300 to 3,400 HZ, the sampling frequency is chosen to be 12 KHZ. For information input signals having a maximum amplitude of ±5 V, a quantizing interval of 2.5 millivolts per least significant binary bit is selected for ADC 16, controlled noise source 14 is designed to generate a 6 KHZ signal having an amplitude of about 2.5 volts, and the summing network attenuator is designed to attenuate the output from filter 13 to a value lying in the range from about 0.625 to about 1.25 millivolts.

At the receiving end of the system, the digital information signals on transmission medium 18 are coupled to the data input of a conventional digital-to-analog converter 22. DAC 22 preferably comprises a 12 bit digital-to-analog converter having a resolution of 2.5 millivolts and an output range coextensive with the analog input range of ADC 16. The clock input to DAC 22 is coupled to the output of sample clock 20 by means of conductor 21 so that DAC 22 is clocked at the same rate as ADC 16. The output of DAC 22 is coupled to the input of a post sampling filter 24, which comprises a band pass filter having a pass band characteristic substantially identical to that of presampling filter 11. The output of post sampling filter 24 is coupled to the input of a suitable utilization device, e.g. a standard telephone handset receiver.

In operation, analog information signals from analog signal source 10 are passed through presampling filter 11, where undesired frequency components are substantially reduced or eliminated, and summed in summing junction 12 with the filtered controlled noise signals from source 14. The composite signal is sequentially sampled in sample and hold circuit 15 and converted to digital form in ADC 16, with both sampling and conversion occurring at the rate of 12 KHZ. The received digital information signals conducted along transmission medium 18 are reconverted into analog form by DAC 22 clocked at the 12 KHZ rate. The resulting analog signal output from DAC 22 are filtered by post sampling filter 24 to remove substantially all those frequency components lying outside the desired frequency range, and are then coupled to utilization device 25.

FIGS. 2 and 3 are performance curves illustrating the improved operation of a digital information transmission system using controlled noise signal injection. FIG. 2 is a plot of idle channel noise in decibels measured at the output of filter 24 vs. amplitude of the controlled noise signal train generated by controlled noise source 14 and passed through a narrow band filter 13 having a Q of 20. Several plots are illustrated showing the idle channel noise response of the system measured with an A.C. volt meter coupled to the output of filter 24 in response to a 1 KHZ disturbing signal of various amplitudes ranging from 3.7 to 40 millivolts, with the system operating at a sampling rate of 12 KHZ. For this test, ADC 16 was adjusted to the zero quantizing level transition point simulating the worse case drifted zero level. For each amplitude of the disturbing signal, the amplitude of the controlled noise source was varied from about 0 to about 65 mv and the results plotted in the curves as shown. The minimum idle channel noise for each amplitude of the disturbing signal is obtained for controlled noise source amplitudes in the range from about 25 to about 50 mv., which corresponds to from ¼ to ½ the magnitude of the test quantizing interval of 100 mv. For small amplitude disturbing signals of 5 millivolts or less, idle channel noise is suppressed by about 9 decibels. It should be noted that idle channel noise suppression for small disturbing signals can be increased to 10 decibels by using a narrow band filter 13 having a Q of 50.

FIG. 3 is a plot of cross talk noise in decibels measured at the output of filter 24 versus amplitude of the controlled noise source generated by source 14 for small amplitude disturbing signals of 5 millivolts rms of 3 different frequencies, viz. 200 HZ, 1 KHZ and 3.2 KHZ. The system response was measured with a wave analyzer tuned to the frequency of the disturbing signal.

The results indicate that the maximum suppression of cross talk noise, viz. 16 decibels, is obtained when the controlled noise source has an amplitude in the range from about 25 to about 75 mv. rms, corresponding to from ¼ to ¾ of the magnitude of the test quantizing level of 100 mv. Further, the range of effective values of the amplitude of the controlled noise signal is substantially independent of the frequency of the disturbing signal.

The reduction in quantizing error obtained by the controlled noise injection technique of the invention was indirectly measured by examining the output from post sampling filter 24 with a wave analyzer adjusted to several different frequencies with a sinusoidal input signal of 600 HZ in the absence of a controlled noise signal and comparing these results with those obtained in the presence of a controlled noise signal having an amplitude of 25 millivolts rms and a frequency of 6 KHZ. This was done for three different amplitude values of the 600 HZ input signal, viz. 100 mv. rms, 200 mv. rms and 400 rms. The test was repeated for an input signal of 700 HZ for the same three amplitude ranges. The results of the test are tabulated in FIGS. 4 and 5. As can be seen from these Figs., third harmonic distortion is reduced by up to 12 decibels with the use of controlled noise injection.

As will now be apparent, digital information transmission systems constructed in accordance with the teachings of the invention described above provide greatly improved performance over known systems. More specifically, idle channel noise, cross talk and quantizing error noise are substantially reduced without the necessity for the introduction of costly and complicated additional circuitry. Moreover, the invention can be readily applied to existing digital information transmission systems by simply adding summing network 12, narrow band filter 13, and controlled noise source 14 at the data input of an existing sample and hold circuit. It should be noted that in systems not requiring a sample and hold circuit, the output of summing network 12 may be coupled directly to the data input of the ADC. Further, while the invention has been specifically described with reference to a digital information transmission system, the invention may also be employed in other signal processing systems, such as a digital video recording system, to great advantage. It is further noted that the invention may be employed in digital information transmission systems which include a compressor upstream of the ADC and an expander downstream of the DAC. In such systems, the invention is capable of significantly reducing both idle channel and cross talk noise.

While the above provides a full and complete disclosure of the preferred embodiment, various modifications, alternate constructions and equivalents may be employed without departing from the true spirit and scope of the invention. For example, while the invention has been described with reference to a digital information transmission system having a single sample and hold circuit 15, ADC 16, transmission medium 18 and DAC 22, the invention finds ready application to systems having several sets of these elements and also to systems operating in the duplex mode. Therefore, the above description and illustration should not be construed as limiting the scope of the invention, which is defined by the appended claims.

What is claimed is:

1. A method of reducing idle channel, cross talk and quantizing error noise in a digital information transmission system, said method comprising the steps of:
   a. generating an analog input signal having a spectral content lying within a predetermined operating frequency band;
   b. generating a controlled noise signal train having a spectral content devoid of frequency components within the limits of said operating frequency band and narrowly centered about a predetermined frequency lying substantially outside said operating frequency band by producing a signal train and narrowly filtering said signal train to remove substantially all components having a frequency deviating from said predetermined frequency;
   c. combining said analog input signal and said controlled noise signal train to produce a composite signal;
   d. converting said composite signal to digital form at a sampling rate substantially greater than the upper limit of said predetermined frequency band by quantizing said composite signal with a predetermined number of quantizing levels each having a predetermined magnitude;
   e. subsequently reconverting said digital signals to analog form; and,
   f. filtering said reconverted analog signal to remove substantially all the frequency components lying outside said predetermined operating frequency band, said step (b) of generating further including the step of limiting the amplitude of said controlled noise signal train to a range from about ¼ to about ½ the magnitude of said quantizing levels.

2. The method of claim 1 wherein said step (a) of generating includes the step of filtering said input signal to remove substantially all frequency components lying outside said predetermined operating frequency band.

3. The method of claim 1 wherein said step of filtering is performed with a band pass filter having a pass band centered about said predetermined frequency and a Q not less than 20.

4. The method of claim 1 wherein said step of combining includes the step of algebraically summing said analog input signal and said controlled noise signal train.

5. The method of claim 1 wherein said predetermined frequency lies above said operating frequency band.

6. The method of claim 1 wherein said predetermined frequency is substantially $(n+\frac{1}{2})$ times said sampling frequency, where $n=0, 1, 2,\ldots$ 7. The method of claim 1 wherein said predetermined operating frequency band is in the range of about 300 to about 3,400 HZ, said predetermined frequency is substantially 6,000 HZ, and said sampling rate is substantially 12,000 HZ.

8. The method of claim 1 wherein said step (f) of filtering is performed with a band pass filter having a pass band co-extensive with said predetermined operating frequency band.

9. A system for transmitting information from a first location to a second location in digital form with reduced errors due to idle channel, cross talk and quantizing error noise, said system comprising:
   input terminal means adapted to be coupled to a source of analog information signals at said first location, said analog information input signals having a spectral content lying within a predetermined operating frequency band;
   means for generating a controlled noise signal train having a spectral content devoid of frequency components within the limits of said operating frequency band and narrowly centered about a predetermined frequency lying substantially outside said operating frequency band;
   means coupled to said input terminal means and said generating means for combining said analog information signals with said controlled noise signal train to produce a composite signal;
   means for converting said composite signal to equivalent digital form by quantizing said composite signal with a predetermined number of quantizing levels each having a predetermined magnitude with a predetermined sampling frequency;
   said generating means including means for limiting the amplitude of said controlled noise signal train to a range from about ¼ to about ½ the magnitude of said quantizing levels;

transmission means having an input coupled to the output of said converting means for transmitting said digital signals to said second location;

means at said second location for reconverting said digital signals to equivalent analog form; and, means for filtering said reconverted analog signals to remove substantially all frequency components lying outside said predetermined operating frequency band.

10. The combination of claim 9 wherein said converting means includes an analog-to-digital converter having a data input for receiving said composite signal and a clock input, said reconverting means includes a digital-to-analog converter having a data input coupled to said transmission medium at said second location and a clock input, and further including means having an output coupled to said clock input of said analog-to-digital converter and said clock input of said digital-to-analog converter for generating a signal train for sampling said analog-to-digital converter and said digital-to-analog converter, said sampling signal train having a frequency substantially greater than the upper limit of said predetermined frequency band.

11. The combination of claim 9 wherein said combining means includes a summing network having a first input coupled to said input terminal means and a second input coupled to the output of said generating means, and an output coupled to the input of said converting means.

12. The combination of claim 9 wherein said converting means includes a sample and hold circuit having an input coupled to said combining means.

13. The combination of claim 9 wherein said predetermined frequency lies above said operating band.

14. The combination of claim 9 wherein said predetermined frequency is substantially $(n+½)$ times said sampling frequency, where $n=0, 1, 2,$.

15. The combination of claim 9 wherein said predetermined operating frequency band is in the range from about 300 to about 3,400 HZ, said predetermined frequency is substantially 6,000 HZ, and said sampling frequency is substantially 12,000 HZ.

16. A system for converting analog signals to equivalent digital signals for subsequent processing, said system comprising:

input terminal means adapted to be coupled to a source of analog information signals having a spectral content lying within a predetermined frequency band;

means for generating a controlled noise signal train having a spectral content devoid of components within the limits of said operating frequency band and narrowly centered about a predetermined frequency lying substantially outside said operating frequency band;

means coupled to said input terminal means and said generating means for combining said analog information signals with said controlled noise signal train to produce a composite signal; and, means coupled to said combining means for converting said composite signal to equivalent digital form by quantizing said composite signal with a predetermined number of quantizing levels each having a predetermined magnitude with a predetermined sampling frequency, said converting means including an output terminal means for manifesting said equivalent digital signals;

said generating means including means for limiting the amplitude of said controlled noise signal train to a range from about ¼ to about ½ the magnitude of said quantizing levels.

17. The combination of claim 16 wherein said converting means includes an analog-to-digital converter having a data input for receiving said composite signal and a clock input, and means having an output coupled to said clock input for generating a signal train for sampling said analog-to-digital converter, said clock signal train having a frequency substantially greater than the upper limit of said predetermined frequency band.

18. The combination of claim 16 wherein said combining means includes a summing network having a first input coupled to said input terminal means, a second input coupled to the output of said generating means, and an output coupled to the input of said converting means.

19. The combination of claim 16 wherein said converting means includes a sample and hold circuit having an input coupled to said combining means.

20. The combination of claim 16 wherein said predetermined frequency lies above said operating frequency band.

21. The combination of claim 16 wherein said predetermined frequency is substantially $(n+½)$ times said sampling frequency, where $n=0, 1, 2,$.

22. The combination of claim 16 wherein said predetermined frequency band is in the range from about 300 to about 3,400 HZ, said predetermined frequency is substantially 12,000 HZ, and said sampling frequency is substantially 12,000 HZ.

* * * * *